US008745357B2

(12) United States Patent
Tucek et al.

(10) Patent No.: US 8,745,357 B2
(45) Date of Patent: Jun. 3, 2014

(54) REMAPPING FOR MEMORY WEAR LEVELING

(75) Inventors: Joseph A. Tucek, Palo Alto, CA (US); Eric A. Anderson, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 13/259,593

(22) PCT Filed: Nov. 30, 2009

(86) PCT No.: PCT/US2009/066089
§ 371 (c)(1),
(2), (4) Date: Sep. 23, 2011

(87) PCT Pub. No.: WO2011/065957
PCT Pub. Date: Jun. 3, 2011

(65) Prior Publication Data
US 2012/0233381 A1   Sep. 13, 2012

(51) Int. Cl.
*G06F 12/10*   (2006.01)
(52) U.S. Cl.
USPC ............... 711/209; 711/103; 711/E12.008; 711/E12.014
(58) Field of Classification Search
USPC ........... 711/103, 203, 209, E12.008, E12.014
See application file for complete search history.

(56) References Cited

U.S. PATENT DOCUMENTS

| 5,897,662 | A  | * | 4/1999 | Corrigan et al. ............... 711/173 |
| 5,953,520 | A  | * | 9/1999 | Mallick ........................... 703/26 |
| 5,956,751 | A  | * | 9/1999 | Lai ................................ 711/172 |
| 2006/0031627 | A1 | * | 2/2006 | Conley ........................ 711/103 |
| 2006/0106972 | A1 | | 5/2006 | Gorobets et al. |
| 2006/0117169 | A1 | * | 6/2006 | Peinado et al. .................... 713/1 |
| 2007/0204128 | A1 | * | 8/2007 | Lee et al. ....................... 711/173 |
| 2008/0155183 | A1 | | 6/2008 | Zhuang et al. |
| 2008/0177937 | A1 | * | 7/2008 | Nishihara et al. ............. 711/103 |
| 2009/0182972 | A1 | * | 7/2009 | Greiner et al. ................. 711/206 |
| 2010/0023800 | A1 | * | 1/2010 | Harari et al. ...................... 714/2 |
| 2010/0161886 | A1 | * | 6/2010 | Toelkes et al. ................ 711/103 |

FOREIGN PATENT DOCUMENTS

| CN | 1290021 C | 12/2006 |
| CN | 1290021D1 | 12/2006 |
| CN | 101346703 A | 1/2009 |
| WO | WO-02058074 A2 | 7/2002 |

* cited by examiner

Primary Examiner — Hal Schnee

(57) ABSTRACT

A method and a corresponding apparatus provide for remapping for wear leveling of a memory. The method is implemented as logic and includes the steps of receiving a memory operation, the memory operation including a logical memory address; dividing the logical address into a logical block address portion, a logical line address portion, and a logical subline address portion; translating the logical block address portion into a physical block address; selecting a line remap key; applying the line remap key to the logical line address portion to produce a physical line address; producing a physical subline address portion; and combining the physical block, line, and subline address portions to produce a physical address for the memory operation.

20 Claims, 7 Drawing Sheets

REMAPPING FOR MEMORY WEAR LEVELING

BACKGROUND

Certain memory devices (e.g., flash memory) are prone to a wear-out condition: these memories can only survive a number of update (rewrite or erase and write) cycles, although the number can be quite large (one hundred thousand or more). To compensate for this condition, these memory devices may employ a process called wear leveling, which involves monitoring relative use of memory areas and a mapping between logical and physical areas of a memory to ensure that all physical areas of the memory wear down at similar rates. Wear leveling helps increase the life span of the memory device.

Many prior art techniques have been developed for wear leveling. The functionality associated with these techniques usually is implemented in the flash translation layer (FTL) and involves maintaining a look-up table that maps logical block of memory to physical block of memory. This look-up table requires roughly one word of state for every memory block. For memories that allow fine-grained updates, maintaining such a translation table at the granularity of individual update units would require very large tables, with a consequent reduction in normal memory capacity.

DESCRIPTION OF THE DRAWINGS

The detailed description will refer to the following drawings in which like numerals refer to like objects, and in which.

DETAILED DESCRIPTION

Figure 1:
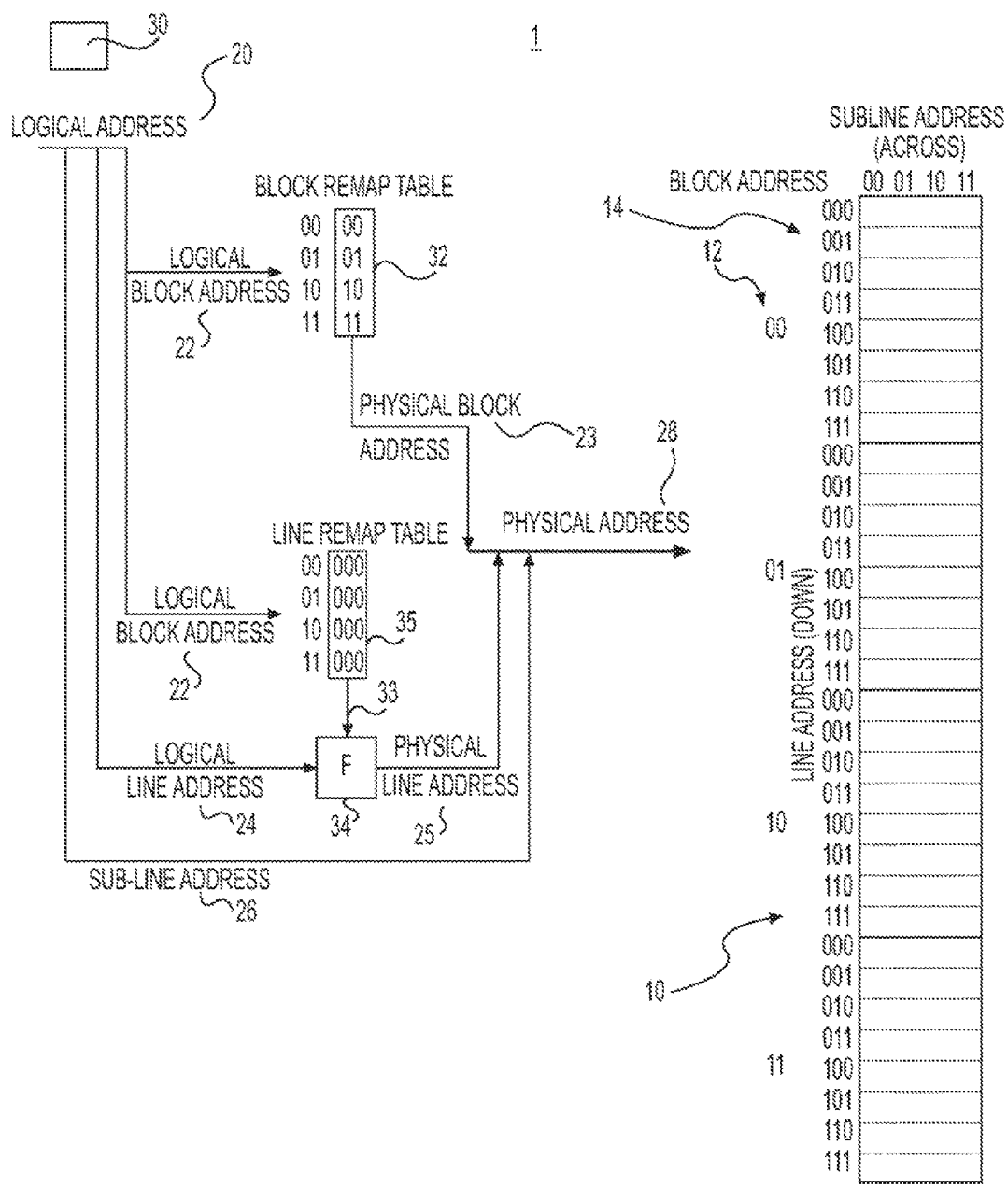
FIG. 1 illustrates an exemplary memory system on which an exemplary remapping for wear leveling process may be implemented.

There are many different technologies used to make memories (e.g., SRAM, DRAM, flash, memristor, PCM, etc). Some, such as SRAM, wear out very slowly (e.g. $10^{21}$ updates), so slowly that for most practical purposes they can be considered to support unlimited updates. Others, such as flash, wear out more rapidly (on the order of $10^5$ updates). Specifically, flash memory is a solid-state, non-volatile memory that can be repetitively reprogrammed. Flash memory includes a number of memory cells, and each cell includes an electrically floating gate positioned over a substrate channel between source and drain regions. A thin gate oxide layer separates the floating gate from the substrate. The threshold level of the cell is controlled by an amount of charge that is placed on the floating gate. If the charge level is above some threshold, the cell is read to have one state, and if below that threshold, is read to have another state.

The desired floating gate charge level is programmed by applying an appropriate combination of voltages to the source, drain, substrate and a separate control gate, for a designated period of time, in order to cause electrons to move from the substrate to the floating gate through the gate oxide layer. Current leakage from the floating gate is very small overtime, thereby providing permanent storage. The charge level on die floating gate can be reduced by an appropriate combination of voltages applied to the elements described above, but it is preferable to include a separate erase gate that is positioned adjacent the floating gate with a thin layer of tunnel oxide between them.

Another memory technology, memristive memories, work through the memristive effect. When current is run though certain materials, (e.g. titanium dioxide, their resistance can be changed, and this change is very durable; the material remembers its resistance, hence memristor. This effect, is not prominent at the macro scale, but becomes prominent at the micro scale. A memristive memory cell consists of a thin film of memristive material between two conductors. By applying high current in a particular direction through, the conductor, the resistance of the thin film can be increased or decreased. This changed resistance can then be measured, without changing it, using low currents. Memristive devices may be created in crossbar arrays, where there is a layer of many parallel conductive wires, then on top of that a thin film of memristive material, and then on top of that a layer of parallel conductive wires mat are perpendicular to the first layer of conductive wires.

Regardless of the technology of an individual cell, a large number of such cells form a memory. The cells are preferably arranged on a semiconductor integrated circuit chip in a two-dimensional array with a common control gate provided for a row of such cells as a word line and the cells in each column having either their drain or source connected to a common bit line. Each cell is then individually addressable by applying the appropriate voltages to the word and bit lines that intersect at the desired cell. Rather than providing for such individual addressing for the purpose of updating (either rewriting, or erasing and then writing) the cells; however, groups of cells are generally connected together to allow ail of the cells in a group to be updated at the same time. In flash memories, such groups are called erase blocks, as they typically are fairly large. Flash memories typically provide for writes at a smaller granularity than erases are provided for, but in order to change the contents of a group of cells they must first be erased, so an update can only occur at the level of the erase block.

Different memory systems have advantages for a different applications (e.g. due to cost, non-volatility, power use, etc.). However, as mentioned previously, some memory technologies have a limited lifetime in terms of the number of times they can be updated (or reprogrammed, or erased, or whatever terminology applies to the specific memory technology). As the number of cycles to which a cell is subjected to increases, the physical properties of the cells change, for flash specifically, as the number of cycles reaches a few tens of thousands, it begins to take more voltage and/or time to both program and erase the cell. This is believed to be due to electrons being trapped in the respective gate and tunnel dielectric layers during repetitive programming and erase cycles. The number of trapped electrons change the operating characteristics of the cell, and at some point (approximately 100 thousand cycles), so much voltage or time is required to program or erase the cell, or both, that it becomes impractical to use it any further. In memristive systems, it is believed that metal migration in the conductive wires causes it to be difficult to drive sufficient current to the memristive film to effect a change in resistance; depending on the specifics of the device the number of cycles at which this occurs varies, hut current devices can last a few thousand to a few tens of thousands of cycles.

To compensate for this condition, memory devices that suffer from "wear out" may employ a technique or process called wear leveling, which involves monitoring memory usage on a block-by-block basis, and mapping between logical and physical areas of a memory to ensure that all physical areas of the memory wear down at similar rates.

The functionality associated with wear leveling techniques may be implemented in the flash translation layer (FTL), so called because they are most commonly used in conjunction with flash memories. An example of a wear leveling technique involves maintaining a look-up table that maps logical block of memory to physical block of memory. This look-up table requires roughly one word of state for every memory block. Update granularities historically have been quite large; we even call unit of update a block. Newer devices allow smaller update granularities, and it is more appropriate to call such units a line. However, for memories that allow fine-grained updates, maintaining such a translation table at the granularity of individual lines would require very large tables, with a consequent reduction in normal memory capacity.

FIG. 1 illustrates an exemplary memory system 1 on which an exemplary wear leveling operation may be executed using at least block and line remapping functions. In FIG. 1, flash memory 10 is organized into memory units, specifically a large number of blocks 12, each block 12 being flash erasable. Each block 12 comprises a number of lines 14. Each line 14 is the smallest memory unit that is individually updatable. In an embodiment, each block contains a minimum of at least two lines, and more preferably a minimum of eight lines.

Each block 12 is designed to contain a standard computer sector's worth of data plus some overhead fields. Data, indicated by block 30, are received from a computer system. A logical address 20 of a memory location for the data 30 to be written into also is sent by the computer system. This logical address 20 is converted into a physical address 28 by an address translation system.

Thus, in FIG. 1, memory 10 is a 128 byte flash memory with a 4 byte update granularity (line), a 1 byte read granularity, and is organized into 4 blocks 12 of 8 lines 14 (32 bytes) each. The address granularity is byte-level.

The remappings executed by the memory system 1 of FIG. 1 translate logical address 20 into physical address 28. The logical address 20 has three parts, block 22, line 24, and subline 26 addresses. The block address 22 is translated using a complete remap table 32, for example.

The line portion 24 of the address 20 is translated using the logical block address 22 to lookup a line remap key 33 in a line remap table 35. The line portion 24 of the address 20 and the key 33 are passed to function (F) 34, which produces a translated physical line address 25. Using this line address translation allows each block 12 of the memory 10 to use a different remap key for function F, and allows the behavior of the remap function F to be changed.

The subline portion 26 of the address 20 may be passed through without translation. In many memory types, updates can only be done at a line granularity, but reads may be done at a finer granularity; i.e., at the subline level.

As noted above, the logical line address 24 is passed through the function 34, using the line remap key 33. In an embodiment, the function 34 is a two-input function that becomes a bijective on input function if the line remap key 33 is fixed. With a fixed line remap key, any logical line address will map to a possible physical line address, and no two different logical line addresses can map to the same physical line address. Possible bijective functions include XOR, addition, multiplication, various cryptographic functions, a bijective look up table, and a keyed bit swizzling function. In an embodiment, the system 1 may employ one remap function. In another embodiment, the system 1 may use a portion of the line remap key to select among several remap functions.

Figure 2:
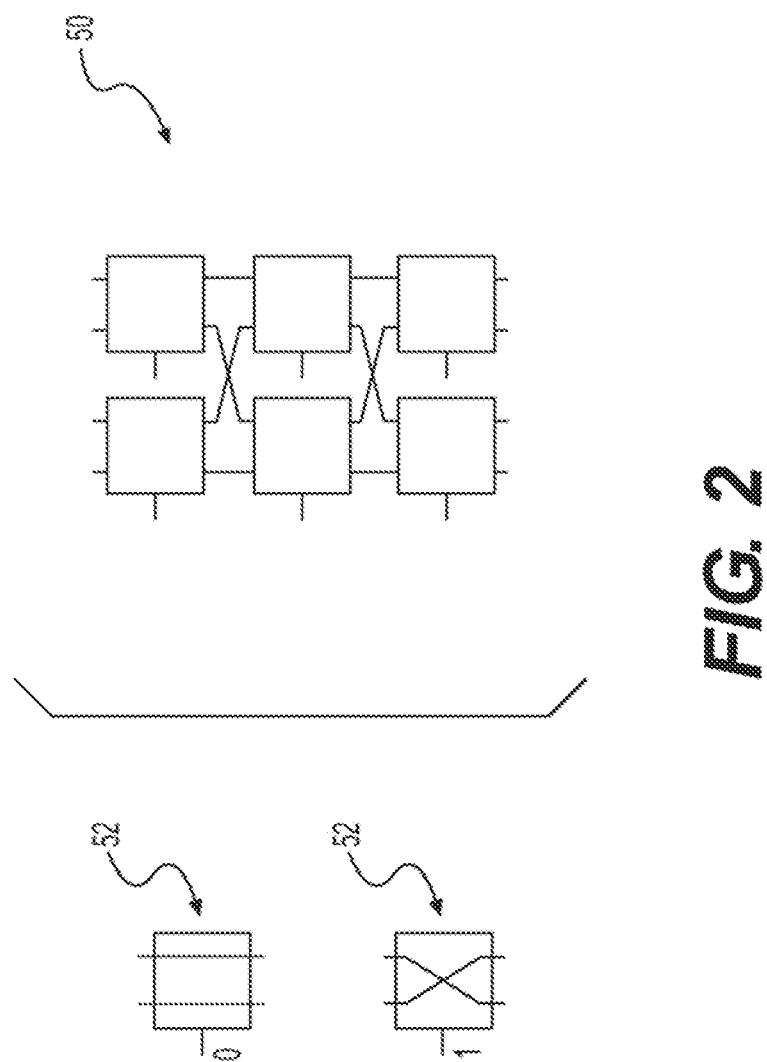
FIG. 2 illustrates a remapping function of the exemplary wear leveling process.

Use of a bit-swizzling function as the function 34 is illustrated in FIG. 2. Swizzling is a process in which an input is shifted, rotated, or mixed. In the context of the memory 10 of FIG. 1, the address bits are shifted according to a specified pattern to produce an output different from the input. In FIG. 2, bit-swizzling function 50 includes a number of swizzling elements 52 that either swap or do not swap locations. As shown networked together, the elements 52 can swizzle the incoming bits into any permutation. In FIG. 2, the function 50 can swizzle four bits into any permutation. The swizzling function 50 takes in six bits (either a 0 or a 1) as a remap control key to control the execution of the elements 52. FIG. 2 illustrates one specific remapping based on values of the six remap control key bits.

The swizzling function 50 can be implemented to accomplish the line remapping portion of the wear leveling process. The line key lookup provides a line remap key (either zero or one) to each element 52 of the swizzle function 50. The line remap module contains the swizzle elements 52.

When the swizzle function 50 is used, a key value of zero means the swizzle element 52 acts as a pass through. If the key value is one, the swizzle element 52 swaps inputs and outputs. For example, if a key value of one is supplied to a swizzle element 52 having an input of 01, the output will be 10: an input of 00 would result in an output of 00; etc. Thus, a four-bit address supplied to the swizzle function 50 will result in a remapping that is bijective. Swizzle logic has the useful property of avoiding repetitive writing to "hot spots" within a memory block and is easy to implement.

Returning to FIG. 1, the memory 10 is shown separated from the translation portions of the memory system 1. The memory system 1 of FIG. 1 may be implemented with the translation portions on a chip separate from the memory 10. In another embodiment, the memory system 1 may be implemented on a single chip. If implemented on the single chip, the logic circuit for deciding when and how to change the remap of the memory may be included on the same chip. Alternatively, the logic can be off-chip with an on-chip interface to the decision logic circuit.

Figure 3:
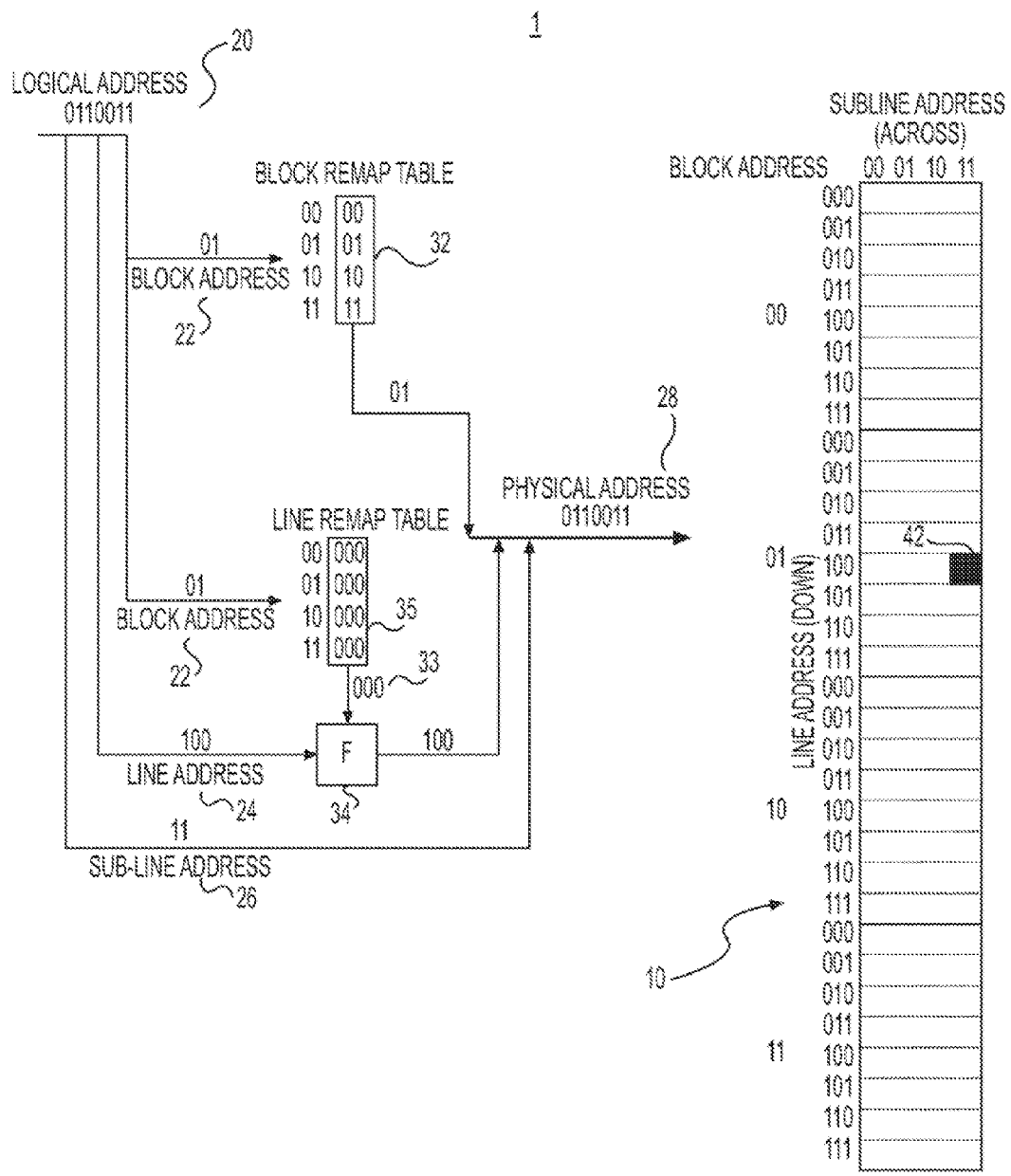
FIGS. 3-5 illustrate exemplary translation operations using the memory device of FIG. 1.

FIG. 3 shows an exemplary wear leveling operation and address translation using the memory system 1 of FIG. 1. Logical address 20 (0110011) is broken up as 01/100/11, for block/line/subline portions. The logical block address 22 (01) is applied to the block remap table 32, and a physical address 23 (of 01) is produced. The logical block address 22 (01) also is applied to the line remap table 35, producing a key 33 (of 000) out. The key 33 (000) and the logical line address 24 (100) are passed to the line remap function F. As discussed above, the line remap function F may be a number of different functions, including the swizzle function of FIG. 2. For the embodiment shown in FIG. 3, the line remap function F is addition modulo 8. Thus, 100+000=100, giving the middle (line) portion 25 of the physical address 28. The subline portion 26 passes through directly, and a physical address 28 of 0110011 is produced; this physical address 28 happens to be the same as the logical address 20. Memory area 42 corresponds to the physical address 28.

Figure 4:
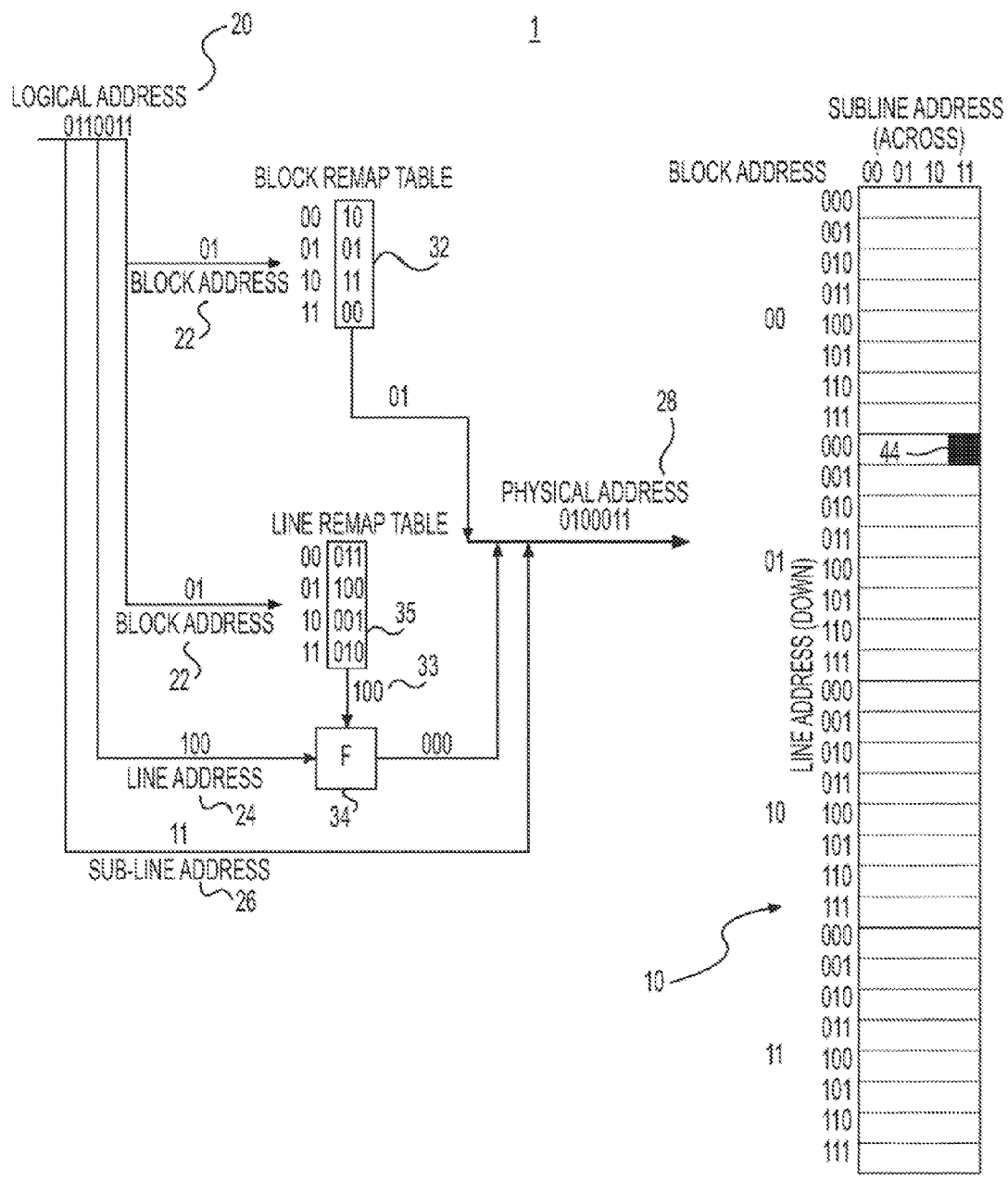

FIG. 4 shows another remapping translation using the same logical address as in FIG. 3, but with the line remapping table 35 changed. The block address 22 is translated from 01 to 01, as before. The line remapping table 35, however, returns 100 for looking up the block address 01. The function F produces: 100+100=000, giving a translated line address 25. This results in a physical address of 0100011, which is different from the physical address produced by the operation of FIG. 3, and different from the input logical address. Memory cell 44 is the relevant memory area.

Figure 5:
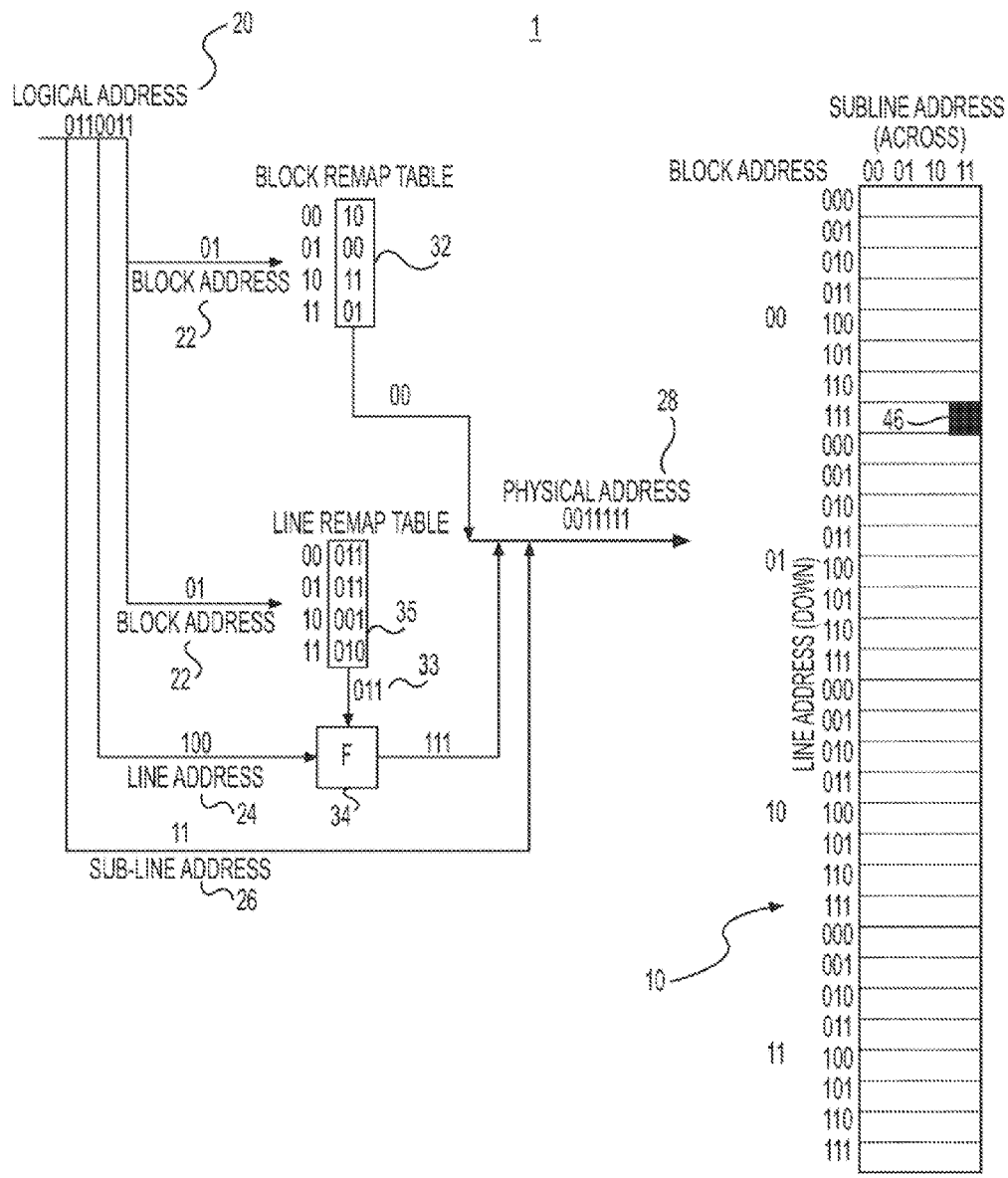

FIG. 5 shows yet another address translation, in FIG. 5, the logical block address 22 is used for the line remapping with the logical block portion 22 of the address 20 translated to 00. The lookup in the line remap table 35 uses the logical block address 22 (01). This gives 011, which when used with the logical line address 24 (100) produces a physical line address 25 of 111. The address components all combine to give a physical address 28 of 0011111. Memory area 46 correspond to this physical address.

Modulo 8 addition is but one example of me function F. As discussed above, a swizzling function also may be used for the remapping. Other remapping functions include XOR, would be both faster and probably give better wear balancing than addition. For addition (and XOR) the key 33 in the line remap table 35 should be the same number of bits as the line portion 24 of the address 20. Other functions have different qualities, e.g. swizzling function 50 would requite a 6 bit key for a 4 bit line address 24.

As noted above, the memory 10 and translation logic of the system 1 may be located on the same chip, or on different chips, in another embodiment, the block remap and line remap tables are combined into one table. The resulting the lookup then would between the 2 bit logical block address and a 5 bit combined physical block and function key.

Figure 6:
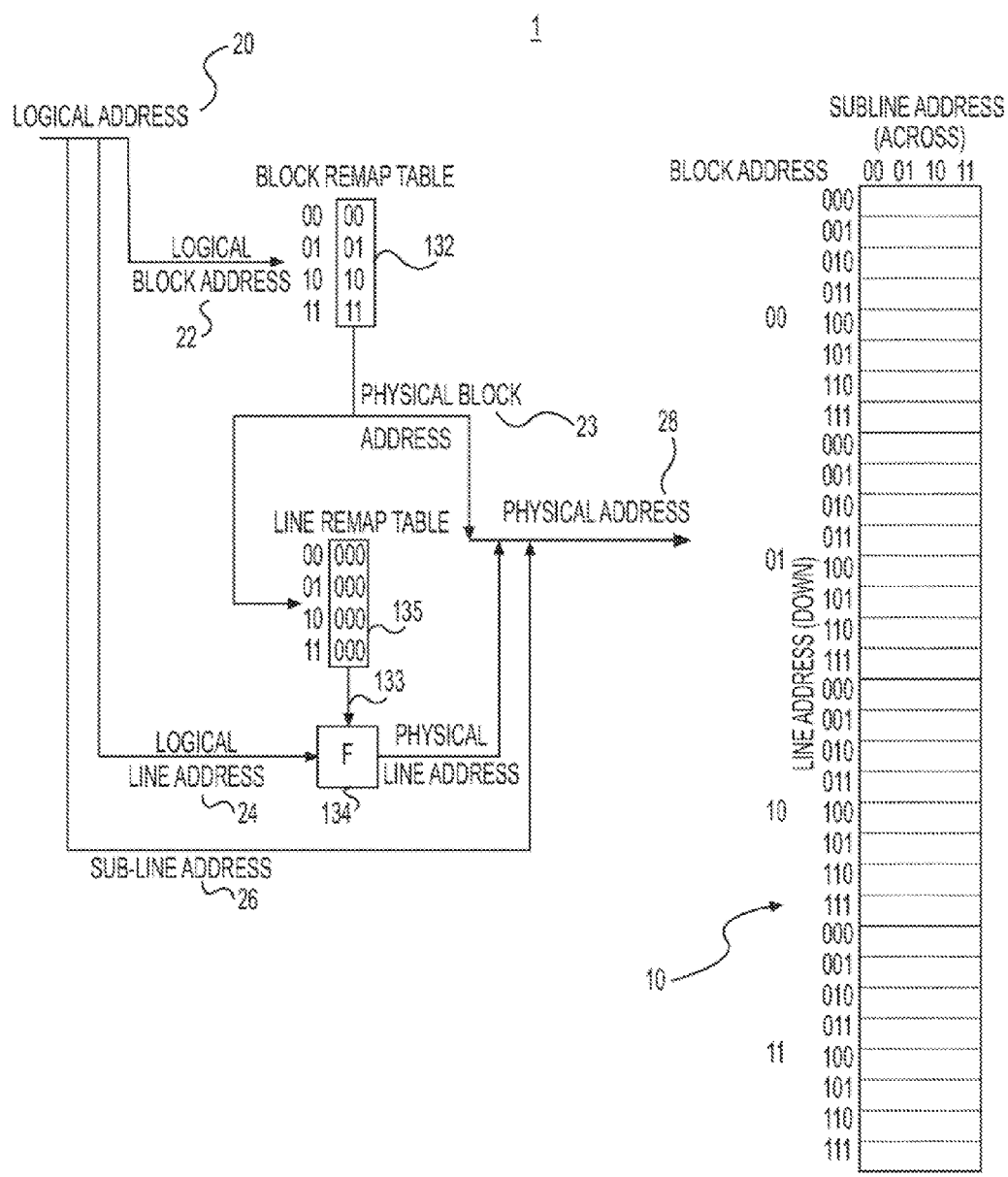
FIG. 6 illustrates an alternate exemplary memory system on which an exemplary wear leveling process may be implemented.

In yet another embodiment, the lookup in the line remap table is based on the physical block address. Such a memory system configuration is shown in FIG. 6. In FIG. 6, memory system 100 includes the same physical memory 10 as before. The logical block address 22 is passed to a block remap module 132, which translates the 3-bit logical block address 22 into a physical block address 23. The physical block address 23 is applied to the physical memory 10 to define the block of memory that receives the write operation, and to line key lookup 135, which is used to produce line remap key 133. The line remap key 133 is used by line remap module 134 to map logical line addresses 24 into physical line addresses 25. The result of these logical-physical address mappings is a specific line in a specific block of physical memory 10 that will receive the write operation. However the system 100 deepens the logic path between receiving a logical address and producing a physical translation. The system 100 also makes tracking that a particular logical page of memory has a particular access pattern (e.g. write to odd address more frequently) more difficult. On the other hand the memory system 100 makes it easier to track that a particular physical block of memory 10 has already been worn in a specific manner.

In FIG. 6, assume that the logical address is a 10-bit address consisting of the first three bits as a logical block address, the next three bits as a logical line address, and the final four bits as an offset or byte address, aid for example is 0011111000 (178). The logical block address 22 bits can take any value from zero to seven. The block remap table 132 provides that, a value of zero maps to one, one maps to four, two maps to there, and so on. The output of the translation process from the block remap table 132 is a physical block address 23. The physical block address is applied to the line key lookup table 135 to acquire a key by which the line address portion of the logical address is to be adjusted. The line remap key performs line remapping within a block of the same block size that the block remapping is performed. Assume that the function implemented by the line key lookup table is an addition function (as noted above, multiplication, swizzling, and other functions also are possible), and that the key is one, if the line address is seven, addition of one to this address results in a line remapping from seven to zero. That is, the line remap key of one is applied at the line remap table 133 to the logical line address 24 to yield a physical line address 25. Assuming further that the offset was 8, the logical address translation from 178 yields 408, or 1000001000. Thus, the physical block address 23, the physical line address 25, and the subline, or offset address 26 are combined to form physical address 28. Note that the block translation portion is a coarse-grain update or translation; the line translation or update is a function-based remapping. Note also that this address translation scheme also allows very fine-grained addressing—to the byte level. However, the offset portion of the address also could be set to zero so that the smallest unit of memory addressed is a line; similarly, by setting the number of bits in the line portion of the address to zero, the smallest memory unit addressed is a block.

With either the memory system 1 of FIG. 1 or the memory system 100 of FIG. 6, if the subline address 26 is 0 bits, the memory system will use a granularity that matches the line size. However, a line size may be between 4 and 64 bytes, and with, between about 256 and 4096 lines per block, block sizes should be between 512 bytes and 1 megabyte. Hence expected line address size would be between 8 to 12 bits. This is, however, largely a result of the rest of the architecture (e.g. 64 byte cache-line size makes 64 byte line convenient; block sizes equal to or a power of 2 multiple of the memory page size is also convenient).

Figure 7:
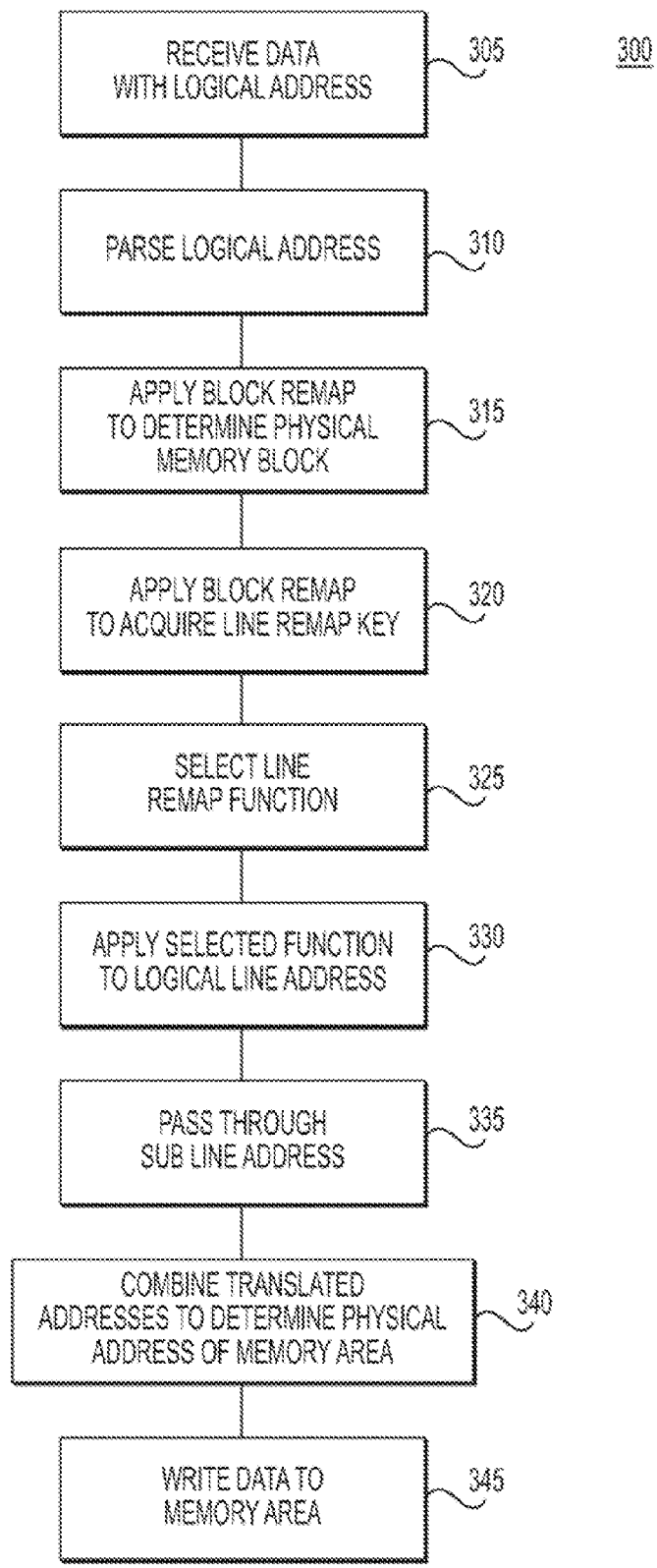
FIG. 7 illustrates an exemplary wear leveling process.

FIG. 7 is a flowchart illustrating an exemplary wear leveling operation 300 applied to the memory system 1 of FIG. 1. In FIG. 7, the operation 300 begins with an operation to write data 30 to an area of the memory 10; the data 30 are accompanied by a logical address. To prevent excessive wear, or memory "hot spots," a wear leveling technique that involves translation down to the line level is applied.

In block 310, the logical address is parsed into block, line, and subline address portions, and the address portions are applied to respective elements of a memory translation subsystem. In block 315, the logical block address portion is applied first to block remap table 32 to produce a physical block address. The block translation table may use any function that produces an address translation for at least some applied logical block address portions. The logical block address also is applied to a line remap table 35 to select a key 33 (block 320). In block 325, the desired line remap function F (34) is combined with the line remap key 33 to form a bijection. The bijection is used in block 330 to produce a physical line address.

The subline address portion is passed through the translation logic (block 335) and in block 340 is combine with the physical block address and the physical line address to produce a physical address. The write operation then is executed writing data 30 to the produced physical address, block 345, and the operation 300 ends.

We claim:

1. A method for remapping for wear leveling of a memory, the method implemented as logic, comprising:
   receiving a memory operation, the memory operation including a logical memory address;
   dividing the logical address into a logical block address portion, a logical line address portion, and a logical subline address portion;
   performing a block remapping, producing a physical block address;
   selecting a line remap key using one of the logical block address portion and the physical block address to perform a line remapping within a block of a same block size that the block remapping is performed;
   applying the line remap key to the logical line address portion to produce a physical line address;
   producing a physical subline address; and combining the physical block, line, and subline addresses to produce a physical address for the memory operation.

2. The method of claim 1, wherein performing the block remapping comprises translating the logical block address portion into the physical block address.

3. The method of claim 1, wherein selecting a line remap key comprises applying the logical block address portion to a line remap table.

4. The method of claim 1, wherein selecting a line remap key comprises applying the physical block address to a line remap table.

5. The method of claim 1, wherein applying the line remap key to the logical line address portion to produce a physical line address comprises applying the line remap key to a line remap function, and wherein the line remap key is varied.

6. The method of claim 5, wherein the line remap function is one of a swizzle function, a Bob Jenkins hash, addition modulo, multiplication, and a cryptographic function.

7. The method of claim 6, wherein logic for the remapping is provided on a same chip as the memory.

8. The method of claim 5, wherein the line remap function is one of a keyed bit swizzle function, an XOR function, and a multiplication by an odd key modulo an address size.

9. The method of claim 1, wherein logic for the remapping is provided on a first chip, and the memory is provided on a second chip.

10. The method of claim 9, wherein the memory is a memory type having a limited lifetime caused by wear out, including one of a flash memory, a memristor, and a phase-change memory.

11. A remapping apparatus, used for wear leveling and implemented as logic, wherein a memory receives translated physical addresses for certain memory operations, the translated physical addresses providing a leveling of use of areas of the memory, comprising:
    an address parsing function that divides a logical address into logical block, line, and subline address portions;
    a block remap table that performs a block remapping to produce a physical block address;
    a line remap table that provides a line remap key using one of the logical block address portion and the physical block address to perform a line remapping within a block of a same block size that the block remapping is performed;
    a line remap function that receives the line remap key and produces a physical line address;
    a subline translation device that produces a physical subline address based on the logical subline address portion; and
    a physical address function that produces a physical address based on the physical block, line, and subline addresses, wherein the physical address designates the location in the memory for a memory operation.

12. The apparatus of claim 11, wherein the block remap table performs the block remapping by translating the logical block address portion into the physical block address.

13. The apparatus of claim 11, wherein the line remap key is determined by applying the logical block address portion to the line remap table.

14. The apparatus of claim 11, wherein the line remap key is determined by applying the physical block address to the line remap table.

15. The apparatus of claim 11, wherein the line remap function is one of a swizzle function, a Bob Jenkins hash, addition modulo, multiplication, and a cryptographic function.

16. The apparatus of claim 15, wherein the logic for remapping is provided on a same chip as the memory.

17. The apparatus of claim 11, wherein the line remap function is one of a keyed bit swizzle function, an XOR function, and a multiplication by an odd key modulo an address size.

18. The apparatus of claim 11, wherein the block remap table comprises a counter to maintain a count of updates of physical memory blocks.

19. The apparatus of claim 11, wherein the logic for remapping is provided on a first chip, and the memory is provided on a second chip.

20. A method for remapping for wear leveling of a memory, the method implemented as logic, comprising:
    receiving a memory operation, the memory operation including a logical memory address;
    dividing the logical memory address into a logical block address portion, a logical line address portion, and a logical subline address portion;
    performing a block remapping, producing a physical block address;
    using said logical block address, selecting a line remap key to perform a line remapping within a block;
    applying the line remap key and the logical line address to a function which, using the line remap key as an input, produces a physical line address;
    producing a physical subline address; and
    combining the physical block, line, and subline addresses to produce a physical address for the memory operation.

* * * * *